United States Patent
Hartinger et al.

(10) Patent No.: US 9,887,360 B2
(45) Date of Patent: Feb. 6, 2018

(54) METHOD FOR PRODUCING AN ORGANIC LIGHT-EMITTING COMPONENT

(71) Applicant: OSRAM OLED GmbH, Regensburg (DE)

(72) Inventors: Stefan Hartinger, Regensburg (DE); Simon Schicktanz, Regensburg (DE); Thorsten Vehoff, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/541,720

(22) PCT Filed: Jan. 5, 2016

(86) PCT No.: PCT/EP2016/050073
§ 371 (c)(1),
(2) Date: Jul. 6, 2017

(87) PCT Pub. No.: WO2016/110485
PCT Pub. Date: Jul. 14, 2016

(65) Prior Publication Data
US 2017/0358747 A1    Dec. 14, 2017

(30) Foreign Application Priority Data

Jan. 7, 2015 (DE) .................. 10 2015 100 099

(51) Int. Cl.
*H01L 21/00* (2006.01)
*H01L 51/00* (2006.01)
*H01L 51/52* (2006.01)

(52) U.S. Cl.
CPC ...... *H01L 51/0023* (2013.01); *H01L 51/5209* (2013.01); *H01L 51/5225* (2013.01)

(58) Field of Classification Search
CPC ............. H01L 51/0023; H01L 51/5209; H01L 51/5225
(Continued)

(56) References Cited

U.S. PATENT DOCUMENTS

2008/0265759 A1    10/2008 Young et al.
2013/0009199 A1    1/2013 Ingle et al.
(Continued)

FOREIGN PATENT DOCUMENTS

DE    102006045294 A1    3/2008
DE    102010003121 A1    9/2011
(Continued)

OTHER PUBLICATIONS

German Search Report based on application No. 10 2015 100 099.7(8 pages) dated Oct. 30, 2015 (for reference purpose only).
(Continued)

*Primary Examiner* — David S Blum
(74) *Attorney, Agent, or Firm* — Viering, Jentschura & Partner mbB

(57) ABSTRACT

A method for producing an organic light-emitting component is disclosed with providing a carrier, forming a first electrode over the carrier, forming an organic functional layer structure over the first electrode, and forming a second electrode over the functional layer structure. The first and second electrodes and the functional layer structure overlap in an optically active region which extends in the lateral direction and is embodied to generate light. In an optically inactive region extending over the carrier in the lateral direction, an electrically conductive contact layer is formed over the carrier, so that it is in direct physical and electrical contact with the first electrode and/or the second electrode. A first contact section and at least one second contact section of the layer are separated from one another by a lithographic
(Continued)

process, so that they are electrically insulated from one another. The layer is structured by a laser beam.

18 Claims, 4 Drawing Sheets

(58) Field of Classification Search
USPC .......................................................... 438/22
See application file for complete search history.

(56) References Cited

U.S. PATENT DOCUMENTS

| 2015/0008415 | A1* | 1/2015 | Schwab | .............. H01L 51/0023 |
| | | | | 257/40 |
| 2017/0207411 | A1* | 7/2017 | Hoefling | ............. H01L 51/5212 |
| 2017/0309851 | A1* | 10/2017 | Vehoff | .................. H01L 51/442 |
| 2017/0346033 | A1* | 11/2017 | Wehlus | ............... H01L 51/5203 |
| 2017/0346040 | A1* | 11/2017 | Fleissner | ................ H01L 51/56 |

FOREIGN PATENT DOCUMENTS

| DE | 102010042132 A1 | 4/2012 |
| EP | 1515592 A1 | 3/2005 |
| WO | 2011101766 A1 | 8/2011 |
| WO | 2011135045 A1 | 11/2011 |

OTHER PUBLICATIONS

International Search Report based on application No. PCT/EP2016/050073 (7 pages) dated Apr. 1, 2016 (for reference purpose only).

* cited by examiner

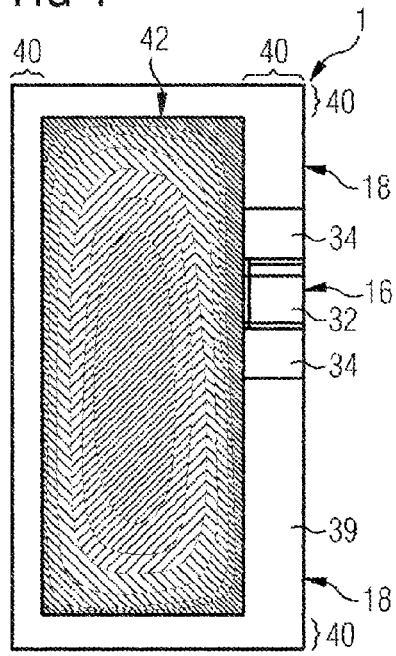
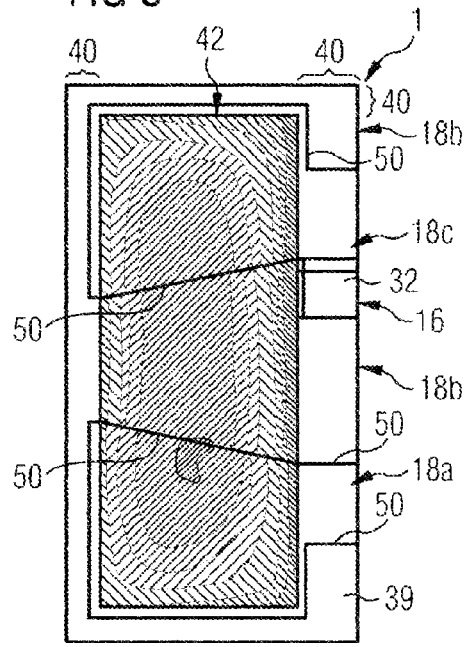
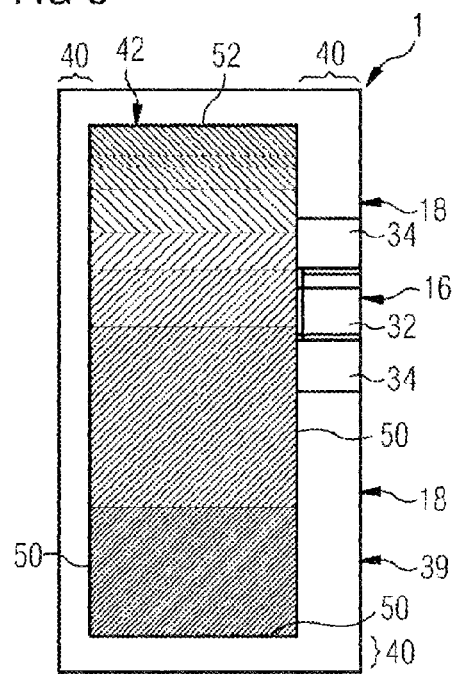

METHOD FOR PRODUCING AN ORGANIC LIGHT-EMITTING COMPONENT

RELATED APPLICATIONS

The present application is a national stage entry according to 35 U.S.C. §371 of PCT application No.: PCT/EP2016/050073 filed on Jan. 5, 2016, which claims priority from German application No.: 10 2015 100 099.7 filed on Jan. 7, 2015, and is incorporated herein by reference in its entirety.

TECHNICAL FIELD

The present disclosure relates to a method for producing an organic light-emitting component.

BACKGROUND

Organically based light-emitting components, so-called organic light-emitting components, are being used increasingly widely. For example, organic light-emitting diodes (OLEDs) are being incorporated to an increasing extent in general lighting, for example as flat light sources.

An organic light-emitting component, for example and OLED, may include an anode and a cathode and an organic functional layer system between them. The organic functional layer system may include one or more emitter layers, in which light is generated, a charge carrier pair generation layer structure respectively consisting of two or more charge carrier pair generation layers ("charge generating layer", CGL) for charge carrier pair generation, and one or more electron barrier layers, also referred to as hole transport layer (HTL), and one or more hole barrier layers, also referred to as electron transport layers (ETL), in order to direct the flow of current.

In a conventional method for producing an organic light-emitting component, one or two electrically conductive layers are formed extensively on a carrier and subsequently structured by means of a photolithographic process. Subsequently, from the electrically conductive layer or layers, two mutually separated and electrically insulated contact sections for electrical contacting of the organic light-emitting component, and a first electrode of the organic light-emitting component, may be formed, the first electrode being physically and/or electrically connected to one of the contact sections and physically separated and/or electrically insulated from the other of the two contact sections. The carrier with the electrically conductive layer or layers is also referred to as a substrate in this application.

A particularly homogeneous luminance distribution or a deliberately inhomogeneous luminance distribution during operation of the organic light-emitting component may, for example, be achieved by means of the structure formed in the photolithographic process. In particular, the luminance distribution depends inter alia on the structure of the contact sections and of the first electrode, as well as on the physical connection between the first electrode and the corresponding contact section and the current feed, connected thereto, to the optically active layers. The structure of the contact sections and of the first electrode is in turn set by means of a lithography mask used in the photolithographic process.

Inhomogeneities in the luminance and/or in the luminance distribution in the active surface of organic light-emitting components are dependent, inter alia, on the electrical properties of the organic functional layers used. In different organic light-emitting components, for example, different organic layers are used and/or combined with one another, particularly in order to achieve different colors, for example red, green, blue or white. During the conventional production of the various organic light-emitting components, however, the different electrical properties are not taken into account for cost reasons. Conventionally, the organic functional layers are always formed on the same substrates, that is to say always with the same electrical contacting, and in particular always with contact sections formed or structured in the same way. This allows a simple production process, during which in particular the same lithography mask may always be used for structuring the contact sections. At the same time, however, depending on the organic functional layers used, this may lead to an undesired luminance distribution.

As an alternative thereto, the electrical properties may already be taken into account during the substrate production by using, for each type of organic light-emitting component, in particular for each type of organic functional layer structure, a separate lithography mask for producing the corresponding individual contact sections. This, however, is elaborate and expensive compared with only one lithography mask.

SUMMARY

The object of the present disclosure is to provide a method for producing an organic light-emitting component, which can be carried out simply and/or economically and contributes to the organic light-emitting component having a predetermined, in particular desired, luminance distribution, for example a homogeneous or predetermined inhomogeneous luminance distribution, during operation.

According to one aspect of the present disclosure, the object is achieved by a method for producing an organic light-emitting component. In the method, a carrier is provided. A first electrode is formed over the carrier. An organic functional layer structure is formed over the first electrode. A second electrode is formed over the organic functional layer structure. The first electrode, the organic functional layer structure and the second electrode overlap in an optically active region which extends in the lateral direction and is configured in order to generate light. In an optically inactive region which extends over the carrier in the lateral direction, an electrically conductive contact layer is initially formed extensively over the carrier, in such a way that it is in direct physical and electrical contact with the first electrode and/or the second electrode. A first contact section and at least one second contact section of the electrically conductive contact layer are subsequently separated from one another by means of a lithographic process, in such a way that they are electrically insulated from one another. The electrically conductive contact layer is subsequently structured by means of a laser beam. At least one further contact section, which is electrically insulated from the second contact layer, is formed by means of the structuring in the electrically conductive contact layer.

According to one aspect of the present disclosure, the object is achieved by a method for producing an organic light-emitting component. In the method, a carrier is provided. A first electrode is formed over the carrier. An organic functional layer structure is formed over the first electrode. A second electrode is formed over the organic functional layer structure. The first electrode, the organic functional layer structure and the second electrode overlap in an optically active region which extends in the lateral direction and is configured in order to generate light. In an optically inactive region which extends over the carrier in the lateral direction, an electrically conductive contact layer is initially formed extensively over the carrier, in such a way that it is in direct physical and electrical contact with the first electrode and/or the second electrode. A first contact section and at least one second contact section of the electrically conductive contact layer are subsequently formed spatially separately from one another by means of a printing process over the carrier, in such a way that they are electrically insulated from one another. The electrically conductive contact layer is subsequently structured by means of a laser beam. At least one further contact section, which is electrically insulated from the second contact layer, is formed by means of the structuring in the electrically conductive contact layer.

The structuring of the electrically conductive contact layer by means of the laser beam makes it possible initially, independently of the subsequent formation of the organic functional layer structures and in particular independently of the materials and the optical properties, associated therewith, of the organic functional layer structure, always to form the same first electrode, the same electrically conductive layer and/or the same contact sections over the carrier, for example by means of a photolithographic process or a printing process. Subsequently, the structure may then be formed by means of the laser beam depending on the subsequent organic functional layer structure or structures, and in particular depending on the materials and the optical properties, associated therewith, of the corresponding organic functional layer structures. In this way, in the case of the photolithographic process, initially the same lithography mask may always be used and the same substrate may always be produced for a multiplicity of organic light-emitting components which are optically different during operation. Subsequently, the different electrical properties may be taken into account and the optical properties, for example the luminance distribution, may be controlled individually via the structuring by means of the laser beam. As an alternative thereto, the entire structuring of the substrate, i.e. without the photolithographic process, may be carried out by means of a laser.

The electrically conductive contact layer may, for example, be formed on the first electrode. For example, the first electrode layer may be extensively formed continuously over the carrier. The electrically conductive contact layer may be formed extensively over the first electrode layer. Subsequently, the electrically conductive contact layer and/or optionally the first electrode layer may be structured by means of a photolithographic process, in such a way that the electrically conductive contact layer and optionally the first electrode layer subsequently include at least one contact section and the first electrode is formed. Optionally, the electrically conductive contact layer may include a first contact section and a second contact section, which is electrically insulated from the first contact section, after the photolithographic structuring. The second contact section is electrically insulated from the second electrode and is physically and electrically connected to the first electrode.

By means of the laser structuring, the current feed to the organic functional layer structure can be influenced, so that the homogeneity of the organic light-emitting component can be influenced. The light pattern of the organic light-emitting component may thus, by expedient configuration of the contacting, either be homogenized and/or rendered uniform, or deliberately made inhomogeneous and/or individualized, for example by a brightness profile being introduced as a design feature in the light pattern. In this case, it is in principle the case that, the longer the distance to be traveled by the current is, the lower the luminance is close to the region in which the current is fed to the organic functional layer structure. It is therefore possible to produce a dark region of low luminance by ensuring that the current must travel a relatively long distance to this dark region, and a bright region of high luminance may be produced by ensuring that the current must travel a relatively short distance to this bright region. This may, in particular, be achieved by fully severing or ablating the entire electrically conductive contact layer, and optionally advantageously also the entire first electrode layer lying thereunder, in the thickness direction by means of the laser beam.

Furthermore, it is in principle the case that the smaller the cross-sectional area of the contact section over which the current flows is, the greater the electrical resistance of the contact section is in the corresponding region. The cross-sectional area of the contact section therefore also influences the current feed, and thereby also the luminance and/or the luminance distribution. It is therefore possible to produce a dark region of low luminance by ensuring that the current must flow through a region of the contact section with a small or reduced cross-sectional area, and a bright region of high luminance may be produced by ensuring that the current must flow through a contact section with a relatively large cross-sectional area to this bright region. An existing cross-sectional area of a contact section may be reduced by means of the laser beam by fully ablating the electrically conductive contact layer, and optionally advantageously the first electrode layer, in the thickness direction, in such a way that the corresponding contact section becomes narrower in the lateral direction. As an alternative or in addition, the existing cross-sectional area of the contact section may be reduced by means of the laser beam by partially ablating the electrically conductive contact layer and/or the first electrode layer in the thickness direction, in such a way that the corresponding contact section becomes narrower in the thickness direction.

The structuring of the electrically conductive contact layer and/or of the first electrode layer by means of the laser beam allows economical and/or variable manufacture by replacing and/or supplementing the rigid mask process by means of the flexible laser process. Furthermore, this makes it possible to improve the yield and the product quality. It furthermore makes it possible to increase the lifetime since current-induced inhomogeneities can be compensated for and electrical stress can be distributed uniformly.

If the substrate is cleaned before a start of evaporation processes in a vacuum to form the organic functional layer structure, as is mostly conventional, then material ablated by the laser beam during the structuring is removed cleanly without an additional working step being required.

By means of the structuring, at least one further contact section, which is electrically insulated from the first contact section and the second contact section, is formed in the electrically conductive contact layer. This makes it possible always to use the same basic substrate with the two contact sections for different organic light-emitting components, and to form one, two or more further contact sections by means of the laser beam depending on the particular organic light-emitting component, in particular its particular organic functional layer structure.

The photolithographic process includes an etching process, in which a mask structure is used. The photolithographic process may always be carried out in the same way, overall relatively rapidly and economically, for a large number of organic light-emitting components. Adaptation, for example homogenization or individualization, of individual organic light-emitting components or a plurality of the organic light-emitting components is carried out after the photolithographic process by means of the structuring by means of the laser beam.

The printing process may always be carried out in the same way, overall relatively rapidly and economically, for a large number of organic light-emitting components. Adaptation, for example homogenization or individualization, of individual organic light-emitting components or a plurality of the organic light-emitting components after the printing process is subsequently carried out by means of the structuring by means of the laser beam.

According to one refinement, the first electrode is transparent and is formed in the optically active region and in the optically inactive region. The electrically conductive contact layer is not transparent and is formed directly on the first electrode in the optically inactive region. In other words, the transparent electrode extends over the optically active region and the optically inactive region, and the nontransparent electrically conductive contact layer is formed on the transparent first electrode in the optically inactive region. This allows good electrical contact between the first electrode and the electrically conductive contact layer. It furthermore makes it possible to form the organic light-emitting component as a bottom emitter or as a transparent OLED. As an alternative or in addition, the second electrode may be configured to be transparent and/or may be formed directly on the electrically conductive contact layer in the optically inactive region. This makes it possible to form the organic light-emitting component as a top emitter or as a transparent OLED.

According to one refinement, the electrically conductive contact layer is structured in such a way that a path length which an electrical current, which flows to or away from the optically active region, after the structuring is different than before the structuring. In other words, the path length is modified by means of the structuring, for example by a detour or a short-cut being produced by means of the structuring. This makes it possible to exert a local influence on the luminance during operation. For example, the luminance may be homogenized by removing local inhomogeneities, or the luminance may be individualized by producing local inhomogeneities.

According to one refinement, the path length after the structuring is longer than before the structuring. In other words, a detour for the electrical current is produced. This makes it possible to reduce the luminance in a bright region and to adapt the luminance to the surrounding regions, or to produce a dark region in which the luminance is less than in the surrounding regions.

According to one refinement, during the structuring of the electrically conductive contact layer, a direct connection between a contact section for feeding or discharging electrical current and the electrode, which is connected to the electrically conductive contact layer, is interrupted. Because of this, during operation the current must flow along a detour inside the electrically conductive contact layer. This contributes to the path length which the electrical current must travel to the optically active region being lengthened. This makes it possible to deliberately reduce the luminance in the optically active region at the end of the path length, in particular of the corresponding distance.

According to one refinement, the path length is determined as a function of a predetermined luminance distribution, and the path length is formed by means of the structuring. For example, in the case of an organic light-emitting component whose electrically conductive contact layer has not been structured by means of the laser beam, the luminance distribution may be recorded. With the aid of this recorded luminance distribution, it is possible to determine the regions in which the luminance should be reduced or increased, and how greatly the luminance should be reduced or increased, in order to achieve a desired and/or predetermined luminance distribution. Depending on the regions which have been determined, and the extent of the reduction or the increase, the minimum path length the electrical current should travel to the corresponding region is then determined. Depending on the path length, it is then possible to determine a corresponding distance. Subsequently, in the case of other organic light-emitting components, which in other regards are advantageously structurally equivalent to the organic light-emitting component whose electrically conductive contact layer has not been structured by means of the laser beam, the structuring of the electrically conductive contact layer is carried out in order to produce the corresponding distance and to set the corresponding path length by means of the laser beam.

According to one refinement, the path length is determined and set, in particular formed, by means of the structuring in such a way that the resulting luminance distribution is homogeneous or at least approximately homogeneous. This contributes to the organic light-emitting component having a uniform appearance during operation.

According to one refinement, the path length is determined in such a way, and the path length is set by means of the structuring in such a way, that the resulting luminance distribution has a predetermined luminance gradient. This can contribute to the organic light-emitting component having an individual and/or inhomogeneous appearance during operation.

According to one refinement, in the case of an organic light-emitting component having an unstructured electrically conductive contact layer, the luminance distribution is recorded. Depending on the recorded luminance distribution and the predetermined luminance distribution, the optical path length is determined and set for the organic light-emitting component. Subsequently, in the case of organic light-emitting components, which in other regards are advantageously structurally equivalent to the organic light-emitting component having the unstructured electrically conductive contact layer, the electrically conductive contact layers are structured in such a way that the corresponding organic light-emitting components have the predetermined luminance distribution.

According to one refinement, the organic light-emitting component is segmented by means of a laser beam in the optically active region. In other words, by means of the laser beam or a further laser beam, the organic light-emitting component may be segmented in such a way that it has individual light-emitting segments. The segments may be allocated mutually independent contact sections for electrical contacting, in which case the contact sections and/or the allocations may be produced by means of the structuring by means of the laser beam.

According to one refinement, during the structuring by means of the laser beam, the electrically conductive contact layer is fully severed and/or ablated in the thickness direction. This makes it possible to form two contact sections, which are physically separated and electrically insulated from one another, from an extensively continuous subregion of the electrically conductive contact layer. As an alternative or in addition, it makes it possible to narrow an existing contact section in the lateral direction and thus reduce its cross-sectional area, so that its electrical resistance increases, so that the luminance and/or the luminance distribution can be influenced. Optionally, a first electrode layer optionally lying under the electrically conductive contact layer may also be fully severed and/or ablated by means of the laser beam. The thickness direction extends in the direction perpendicular to the lateral direction.

According to one refinement, during the structuring by means of the laser beam, the electrically conductive contact layer is only partially severed and/or ablated in the thickness direction. This makes it possible to narrow an existing contact section in the thickness direction and thus reduce its cross-sectional area, so that its electrical resistance increases, so that the luminance and/or the luminance distribution can be influenced. Optionally, a first electrode layer optionally lying under the electrically conductive contact layer may also be partially severed and/or ablated by means of the laser beam, so that its electrical resistance increases, so that the luminance and/or the luminance distribution can be influenced.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 4 shows a plan view of one embodiment of an organic light-emitting component;

FIG. 5 shows a plan view of one embodiment of an organic light-emitting component;

FIG. 6 shows a plan view of one embodiment of an organic light-emitting component;

DETAILED DESCRIPTION

In the following detailed description, reference is made to the appended drawings, which form part of this description and in which specific embodiments, in which the present disclosure may be carried out, are shown for illustration. Since components of embodiments may be positioned in a number of different orientations, the direction terminology is used for illustration and is in no way restrictive. It is to be understood that other embodiments may be used and structural or logical modifications may be carried out, without departing from the protective scope of the present disclosure. It is to be understood that the features of the various embodiments described herein may be combined with one another, unless otherwise specifically indicated. The following detailed description is therefore not to be interpreted in a restrictive sense, and the protective scope of the present disclosure is defined by the appended claims. In the figures, elements which are identical or similar are provided with identical references, if this is expedient.

In various embodiments, an organic light-emitting component may be an organic light-emitting semiconductor component and/or be configured as an organic light-emitting diode or as an organic light-emitting transistor. The radiation may, for example, be light in the visible range, UV light and/or infrared light. In this context, the electromagnetic radiation-emitting component may, for example, be configured as an organic light-emitting diode (OLED) or as an organic light-emitting transistor. In various embodiments, the organic light-emitting component may be part of an integrated circuit. Furthermore, a multiplicity of light-emitting components may be provided, for example fitted in a common housing.

Figure 1:
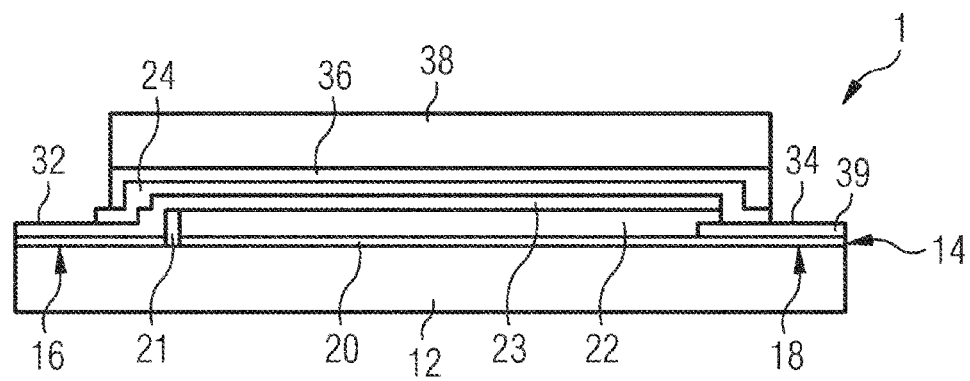
FIG. 1 shows a sectional representation of one embodiment of an organic light-emitting component.

FIG. 1 shows a sectional representation of one embodiment of an organic light-emitting component 1. The organic light-emitting component 1 includes a carrier 12. The carrier 12 may be configured to be translucent or transparent. The carrier 12 is used as a carrier element for electronic elements or layers, for example light-emitting elements. The carrier 12 may for example include or be formed from plastic, metal, glass, quartz and/or a semiconductor material. Furthermore, the carrier 12 may include or be formed from a plastic film or a laminate including one or more plastic films. The carrier 12 may be configured to be mechanically rigid or mechanically flexible.

An active layer structure is formed on the carrier 12. The active layer structure is optically and electrically active during operation of the organic light-emitting component. The active layer structure is therefore an electrically and/or optically active region. In other words, during operation of the organic light-emitting component 1, in the active layer structure, light is generated and electrical current is conducted. The electrically active region is, for example, the region of the optoelectronic component 10 in which electrical current for operation of the optoelectronic component 10 flows. Light is generated in the optically active region. Laterally outside the optically active region, there is an optically inactive region of the active layer structure, in which no light is generated.

The active layer structure includes a first electrode layer 14, which includes a first contact section 16, a second contact section 18 and a first electrode 20. The carrier 12 with the first electrode layer 14 may also be referred to as the substrate. Between the carrier 12 and the first electrode layer 14, a first barrier layer (not represented), for example a first barrier thin film, may be formed. The first electrode 20 is electrically insulated from the first contact section 16 by means of an electrical insulation barrier 21. The first and second contact sections 16, 18 lie in the optically inactive region. The second contact section is formed by a subsection, lying in the optically inactive region, of the first electrode 20. As an alternative thereto, the second contact section is physically and electrically connected to the first electrode 20.

The first electrode 20 may be configured as an anode or as a cathode. The first electrode 20 is configured to be translucent or transparent. The first electrode 20 includes an electrically conductive material, for example metal and/or a transparent conductive oxide (TCO) or a layer stack of a plurality of layers which include metals or TCOs. The first electrode 20 may, for example, include a layer stack of a combination of a layer of a metal on a layer of a TCO, or vice versa. One example is a silver layer which is applied on an indium tin oxide (ITO) layer (Ag on ITO), or ITO-Ag-ITO multilayers. As an alternative or in addition to the aforementioned materials, the first electrode 20 may include: networks of metal nanowires and nanoparticles, for example of Ag, networks of carbon nanotubes, graphite particles and layers and/or networks of semiconducting nanowires.

Formed over the first electrode 20 in the optically active region, there is an organic functional layer structure 22 of the active layer structure. The organic functional layer structure 22 may for example include one, two or more sublayers. For example, the organic functional layer structure 22 may include a hole injection layer, a hole transport layer, an emitter layer, an electron transport layer and/or an electron injection layer. The hole injection layer is used to reduce the bandgap between the first electrode and the hole transport layer. In the hole transport layer, the hole conductivity is greater than the electron conductivity. The hole transport layer is used for transporting the holes. In the electron transport layer, the electron conductivity is greater than the hole conductivity. The electron transport layer is used for transporting the holes. The electron injection layer is used to reduce the bandgap between the second electrode and the electron transport layer. Furthermore, the organic functional layer structure 22 may include one, two or more functional layer structure units, which respectively include the aforementioned sublayers and/or further intermediate layers.

Formed over the organic functional layer structure 22 in the optically active region, there is a second electrode 23 of the optoelectronic layer structure. The second electrode 23 is electrically coupled to the first contact section 16. Optionally, the first contact section 16 may be formed by a subsection, extending into the optically inactive region, of the second electrode 23.

The second electrode 23 may be formed according to one of the configurations of the first electrode 20, in which case the first electrode 20 and the second electrode 23 may be formed identically or differently. The first electrode 20 is used, for example, as an anode or cathode of the optoelectronic layer structure. In correspondence with the first electrode, the second electrode 23 is used as a cathode or anode of the optoelectronic layer structure.

The first electrode 20, the organic functional layer structure 22 and the second electrode 23 therefore overlap in the optically active region. Lying laterally outside the optically active region, there is the optically inactive region of the active layer structure, in which region the first electrode 20, the organic functional layer structure 22 and the second electrode 23 do not overlap.

An electrically conductive contact layer 39 of the active layer structure is formed in the second contact section 18. The electrically conductive contact layer 39 is formed over, in particular directly on, the first electrode layer 14 in the second contact section 18. As an alternative thereto, the electrically conductive contact layer 39 may be formed directly on the carrier 12, or optionally directly on a barrier layer, in the contact section 18. The electrically conductive contact layer 39 is structured in the lateral direction, as explained in more detail below. The electrically conductive contact layer 39 is configured to be nontransparent and/or opaque. The electrically conductive contact layer 39 has a higher electrical conductivity. In particular, the electrically conductive contact layer 39 has a higher electrical conductivity than the first electrode 20. Optionally, the electrically conductive contact layer 39 may also be formed in the first contact section 16, in which case the electrically conductive contact layer 39 may optionally be formed in the first contact section 16 in addition or as an alternative to the first electrode layer 14 and/or the second electrode 23.

Over the first contact section 16, a first contact region 32 is exposed. Over the second contact section 18, a second contact region 34 is exposed. The first contact region 32 is used for electrically contacting the first contact section 16, and the second contact region 34 is used for electrically contacting the second contact section 18.

A getter structure (not represented) may be arranged on or over the active region. The getter layer may be configured to be translucent, transparent or opaque. The getter layer may include or be formed from a material which absorbs and binds substances that are harmful to the active region.

Formed over the second electrode 23 and at least partially over the first contact section 16 and at least partially over the second contact section 18, there is an encapsulation layer 24 which encapsulates the active layer structure. The encapsulation layer 24 may be configured as a second barrier layer, for example as a second barrier thin film. The encapsulation layer 24 may also be referred to as thin-film encapsulation. The encapsulation layer 24 forms a barrier against chemical contaminants or atmospheric substances, in particular against water (moisture) and oxygen. The encapsulation layer 24 may be formed as a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, as well as mixtures and alloys thereof. Optionally, the first barrier layer may be formed on the carrier 12 in correspondence with one configuration of the encapsulation layer 24.

A bonding layer 36 is formed over the encapsulation layer 24. The bonding layer 36 includes for example a bonding agent, for example an adhesive, for example a laminating adhesive, a coating and/or a resin. The bonding layer 36 may, for example, include particles which scatter electromagnetic radiation, for example light-scattering particles.

A cover body 38 is formed over the bonding layer 36. The bonding layer 36 is used for fastening the cover body 38 on the encapsulation layer 24. The cover body 38 includes, for example, plastic, glass and/or metal. For example, the cover body 38 may be formed essentially from glass and include a thin metal layer, for example a metal foil, and/or a graphite layer, for example a graphite laminate, on the glass body. The cover body 38 is used to protect the conventional optoelectronic component 1, for example against the effects of mechanical force from the outside. Furthermore, the cover body 38 may be used to distribute and/or dissipate heat which is generated in the conventional optoelectronic component 1. For example, the glass of the cover body 38 may be used as protection against external influences, and the metal layer of the cover body 38 may be used to distribute and/or dissipate the heat given off during operation of the conventional optoelectronic component 1.

As an alternative or in addition, the first and second contact sections 16, 18 may be formed on the same side of the organic light-emitting component 1, for example on the right-hand side in FIG. 1, successively in a direction perpendicular to the plane of the drawing. Furthermore, two first and/or two second contact sections 16, 18 may optionally be formed in order to electrically contact the second and first electrode 23, 20, respectively. Furthermore, the cover body 38 and the carrier 12 may be formed flush on their sides, and the recesses in which the contact regions 32, 34 are exposed may extend through the cover body 38 and/or the carrier 12.

Figure 2:
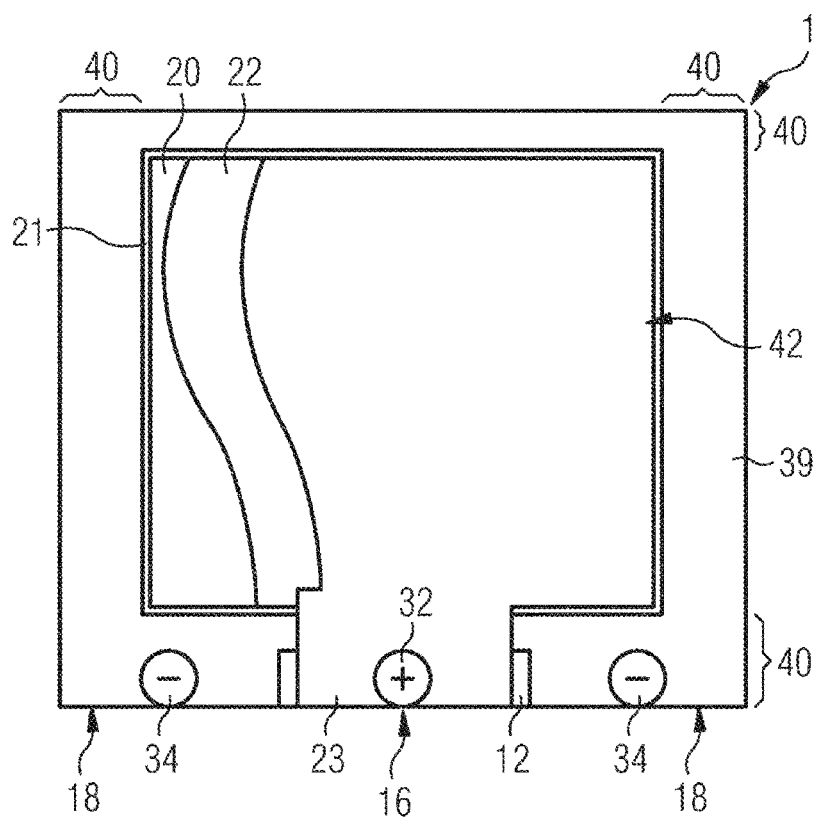
FIG. 2 shows a plan view of one embodiment of an organic light-emitting component.

FIG. 2 shows a plan view of one embodiment of an organic light-emitting component, which may for example correspond substantially in terms of its cross section to the embodiment shown in FIG. 1, the first and second contact sections 16, 18 being formed on the same side of the organic light-emitting component 1. The first electrode 20 forms the cathode, and the second electrode 23 forms the anode.

In FIG. 2, the second electrode 23 and the organic functional layer structure 20 in the optically active region 42 are represented only partially, so that the organic functional layer structure 22 lying under the second electrode 23 and the first electrode 20 lying under the organic functional layer structure 22 can be seen. In reality, the entire optically active region 42 is covered by the organic functional layer structure 22 and the second electrode 23.

The region enclosed by the insulation barrier 21 in FIG. 2 is the optically active region 42 of the organic light-emitting component 1. The region lying outside the insulation barrier 21 in FIG. 2 is the optically inactive region 40 of the organic light-emitting component 1. The second contact section 18 extends in the optically inactive region 40 almost around the entire optically active region 42.

The first electrode 20 protrudes outward below the insulation barrier 21 into the optically inactive region 40 where it is in particular formed under the electrically conductive contact layer 39 and is physically and electrically connected to the electrically conductive contact layer 39. As an alternative thereto, the first electrode 20 may protrude only in sections below the insulation barrier into the optically inactive region 40 and be connected there physically and electrically to the electrically conductive contact layer 39.

In the optically inactive region 40, the insulation barrier 21 extends between the second electrode 23 and the electrically conductive layer 39, and therefore vertically, into the plane of the drawing in FIG. 2, under the second electrode 23, so that no current flows directly from the anode to the cathode without flowing through the organic functional layer structure 22. As an alternative thereto, the electrically conductive contact layer 39 may be structured in such a way that it does not overlap with the second electrode 23, and is correspondingly not formed under the second electrode 23. The electrically conductive contact layer 39 is structured in such a way that the first contact section 16 and the second contact section 18 are physically separated from one another and electrically insulated from one another.

The structurings of the electrically conductive contact layer 39, as explained in the preceding paragraph, may for example be formed by means of surface-wide application, for example deposition, of the electrically conductive contact layer 39 and one, two or more subsequent photolithographic processes, for example by using a mask structure. As an alternative thereto, the first contact section 16 and/or the second contact section 18, which are physically separated from one another and electrically insulated from one another, are formed by means of a printing process.

The organic light-emitting component 1 is suitable, for example, for recording a luminance and/or luminance distribution of the organic light-emitting component 1 without laser structuring of the electrically conductive contact layer 39.

Figure 3:
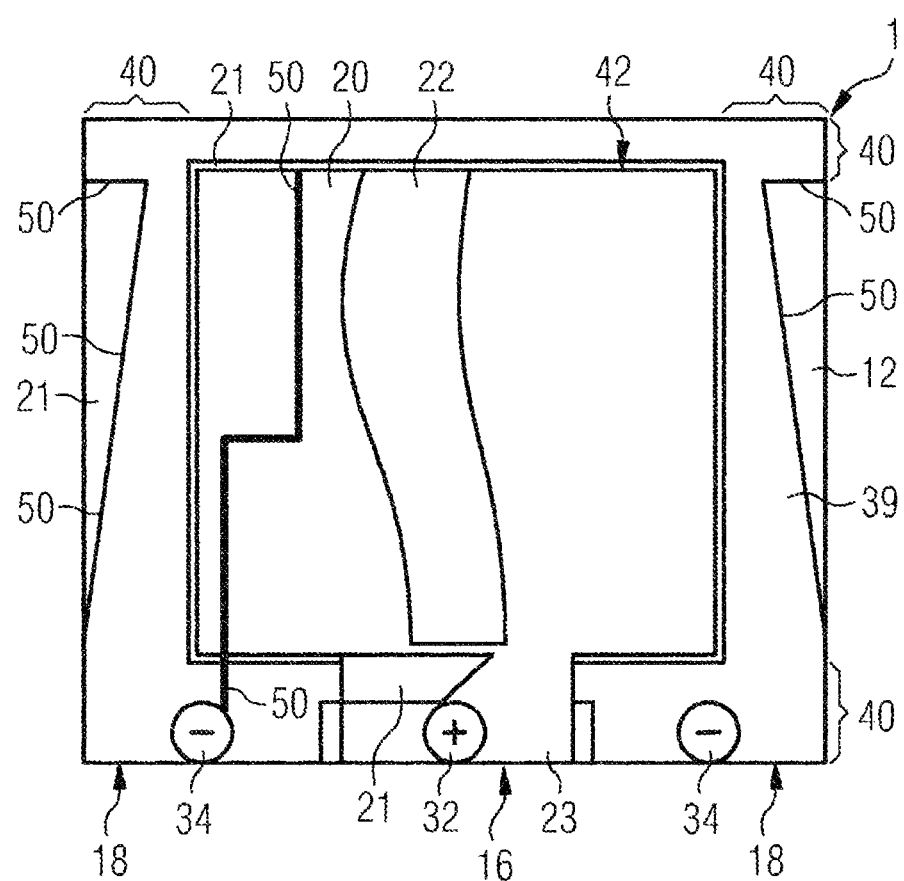
FIG. 3 shows a plan view of one embodiment of an organic light-emitting component.

FIG. 3 shows a plan view of an embodiment of an organic light-emitting component 1, which may for example correspond substantially to the organic light-emitting component 1 shown in FIG. 2, the electrically conductive contact layer 39 having been structured in the optically inactive region 40 by means of a laser beam. In addition, as shown in FIG. 3, the electrically conductive contact layer 39 may also be structured in the optically active region 42 by means of a laser beam.

The structuring by means of the laser beam produces a plurality of laser cuts 50. By means of the laser cuts 50, lines or surfaces of the electrically conductive contact layer 39 can be removed so that corresponding lines or surfaces of the underlying layers are exposed. The lines may have a width in a range of for example from 10 µm to 1000 µm, for example from 50 µm to 500 µm, for example approximately 100 µm. The surfaces may for example be produced by scanning the surfaces, i.e. by movement of the laser beam to and fro within the surfaces. For example, the first electrode 20, the carrier 12 or optionally the barrier layer may partially be exposed by means of the laser cuts 50.

In FIG. 3, the second electrode 23 is represented as being cut away, so that it can be seen that in the optically inactive region 40 the insulation barrier 21 extends between the second electrode 23 and the electrically conductive contact layer 39 and electrically insulates them from one another. Furthermore, the second electrode 23 and the organic functional layer structure 20 in the optically active region 42 are represented only partially in FIG. 2, so that the organic functional layer structure 22 lying under the second electrode 23 and the first electrode lying under the organic functional layer structure 22 can be seen. In reality, the entire optically active region 42 is covered by the organic functional layer structure 22 and the second electrode 23.

The second contact section 18 extends in the optically inactive region 40 almost around the entire optically active region 42. The first contact section 16 is formed in the optically inactive region 40 only in the region of the second electrode 23. The second contact section 18 includes two first contact regions 32. The first contact section 16 includes a second contact region 34.

The effect of the laser cuts 50 in the optically inactive region 40 is that, from the bottom upwards in the optically inactive region 40 in FIG. 3, the electrically conductive contact layer 39 initially narrows and then widens again at the top, close to the end of the optically active region 42. The same applies for a cross-sectional area, corresponding thereto and extending perpendicularly to the plane of the drawing, of the electrically conductive contact layer 39 and optionally of the first electrode layer 14 under the electrically conductive contact layer 39. By means of this, a constriction is produced for the electrical current flowing during operation, an electrical resistance of the electrically conductive contact layer 39 and optionally of the first electrode layer 14 under the electrically conductive contact layer 39 increasing with a decreasing cross-sectional area. This influences the flow of current and the current distribution in the active region as a whole, and the luminance and luminance distribution in the optically active region 42.

The optional laser cut 50 in the optically active region 42 leads to segmentation of the organic light-emitting component 1, so that the flow of current and the current distribution in the active region as a whole, and the luminance and luminance distribution in the optically active region 42, are likewise influenced. Optionally, the segmentation may be carried out in such a way that two or more segments that can be driven independently of one another are produced.

FIG. 4 shows a plan view of an embodiment of an organic light-emitting component 1, which may for example correspond substantially to the embodiment shown in FIG. 2. In particular, the electrically conductive contact layer 39 does not have any laser structuring, and the first and second contact sections 16, 18 have been formed by means of the photolithographic process or by means of the printing process. In the organic light-emitting component 1, the second contact section 18 in the optically inactive region 40 extends almost around the entire optically active region 42. The second contact section 18 includes two second contact regions 34. The first electrode 20, connected to the second contact section 18, forms the anode, and the second electrode 23, connected to the first contact section 16, forms the cathode. The second contact section 18 is physically separated from the first contact section 16 and electrically insulated therefrom.

Furthermore, FIG. 4 shows a luminance distribution in the optically active region 42. The luminance distribution depends on the structure of the electrically conductive contact layer 39 and on the nature of the layers of the organic functional layer structure 22, which for example has an influence on the color of the light emitted. In other words, when using the same substrate and different organic functional layer structures 22, which correspondingly emit light of different colors during operation, the luminance and/or the luminance distribution can be different.

FIG. 5 shows a plan view of one embodiment of an organic light-emitting component 1, which corresponds substantially to the organic light-emitting component 1 shown in FIG. 4, the electrically conductive contact layer 39 having been structured by means of a laser beam, i.e. having been laser-structured, so that the electrically conductive contact layer 39 includes a plurality of laser cuts 50 in the optically inactive region 40. The laser cuts 50 are advantageously so deep that the first electrode layer 14 lying thereunder is optionally also cut through fully by the corresponding laser cuts 50. The laser cuts 50 cut through the electrically conductive electrode layer 39 in such a way that three second contact sections 18a, 18b, 18c separated from one another and electrically insulated from one another are formed.

The effect of the laser cuts 50 in the optically inactive region 40 is that the current flows along a different path during operation than in the case of the organic light-emitting component 1 shown in FIG. 4. The effect of this is that the luminance and the luminance distribution in the organic light-emitting component 1 shown in FIG. 5 is different than in the organic light-emitting component 1 shown in FIG. 4.

The laser cuts 50 may be configured in such a way that the luminance and/or the luminance distribution can be influenced deliberately. For example, an inhomogeneity of the luminance distribution, existing in the absence of laser structuring, may be removed by means of the laser structuring so that the luminance distribution is more homogeneous after the laser structuring than before the laser structuring. As an alternative thereto, a homogeneity of the luminance distribution, existing in the absence of laser structuring, may be removed by means of the laser structuring so that the luminance distribution is more inhomogeneous after the laser structuring than before the laser structuring. For example, a predetermined light pattern and/or appearance may be produced in this way.

For example, different patterns and/or luminance gradients may be produced in this way.

In addition, as shown in FIG. 4, many of the laser cuts 50 may extend over the optically active region 42. No electrically conductive contact layer 39 is formed in the optically active region 42, for which reason the laser cuts 50 only cut through the first electrode 20 there. The effect of the laser cuts 50 in the optically active region 42 is that the luminous surface of the organic light-emitting component 1 is subdivided into three segments. The three segments are each connected electrically to one of the three second contact sections 18a, 18b, 18c, and can be driven via the corresponding contact sections 18a, 18b, 18c. The three segments may optionally be driven independently of one another by correspondingly applying an electrical potential independently of one another to the corresponding second contact sections 18a, 18b, 18c.

FIG. 6 shows a plan view of one embodiment of an organic light-emitting component 1, which corresponds substantially to the organic light-emitting component 1 shown in FIG. 4, the electrically conductive contact layer 39 additionally having been structured by means of a laser beam so that the electrically conductive contact layer 39 includes a plurality of laser cuts 50 at the transition from the optically inactive region 40 to the optically active region 42. The laser cuts 50 are advantageously so deep that the first electrode layer 14 lying thereunder is optionally also cut through fully by the corresponding laser cuts 50.

The effect of the laser cuts 50 in the optically inactive region 40 is that the current flows along a different path during operation than in the case of the organic light-emitting component 1 shown in FIG. 4. The effect of this is that the luminance and the luminance distribution in the organic light-emitting component 1 shown in FIG. 5 is different than in the organic light-emitting component 1 shown in FIG. 4.

The laser cuts 50 cut through the electrically conductive electrode layer 39 in such a way that the current can flow from the second contact regions 34 through the second contact section 18 and only through a section 52 not severed by means of the laser beam into the optically active region 42, or vice versa. The effect of this is that the luminance in FIG. 6 is greater in the upper region of the optically active region 42 close to the unsevered section 52 than below this region. In particular, a luminance gradient extending from the top downward in FIG. 6 is thus produced.

Figure 7:
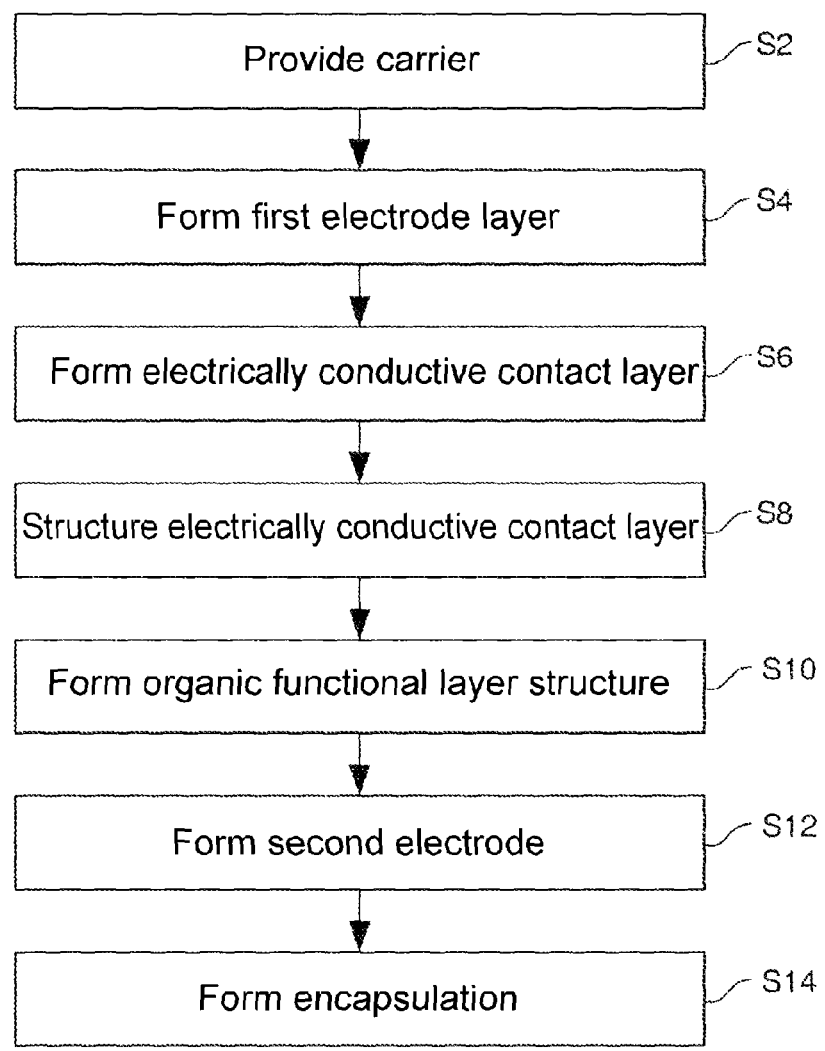
FIG. 7 shows a flowchart of one embodiment of a method for producing an organic light-emitting component.

FIG. 7 shows a flowchart of a method for producing an organic light-emitting component 1, for example one of the organic light-emitting components 1 explained above.

In a step S2, a carrier is provided, for example the carrier 12 explained above.

In a step S4, a first electrode layer is formed; for example, the first electrode layer 14 explained above is formed over the carrier 12.

In a step S6, an electrically conductive contact layer is formed. For example, the electrically conductive contact layer 39 explained above is formed in the optically inactive region 40 and in the second contact region 18 over the first electrode layer 14. The electrically conductive contact layer 39 may, for example, initially be formed extensively and/or without structure, for example be deposited or printed on. Subsequently, the electrically conductive contact layer 39 may optionally be structured by means of a photolithographic method and a mask process, in such a way that it includes at least two contact sections, in particular the first and second contact sections 16, 18.

In a step S8, the electrically conductive contact layer is structured by means of a laser beam. In particular, the electrically conductive contact layer 39 is structured by means of the laser beam in such a way that it subsequently includes more than two contact sections, for example two or more first and/or second contact sections 16, 18, and/or in such a way that a path length for the electrical current flowing through the active region during operation is modified overall, in particular lengthened.

In a step S10, an organic functional layer structure is formed. For example, the organic functional layer structure 22 is formed on the second electrode 20.

In a step S12, a second electrode is formed. For example, the second electrode 23 is formed over the organic functional layer structure 22. The second electrode 23 is formed in such a way that it extends over the first contact region or forms the latter.

In a step S14, an encapsulation is formed. For example, the encapsulation includes the encapsulation layer 24, the bonding layer 36 and/or the cover body 38.

Optionally, an organic light-emitting component 1 may initially be formed without the laser structuring, and be tested and/or measured during operation. In this way, it is possible to determine the luminance and/or the luminance distribution of the organic light-emitting component 1 without the laser structuring. This organic light-emitting component 1 includes a particular organic functional layer structure 22, in particular one which emits light of a particular color during operation.

Depending on the luminance and/or luminance distribution recorded, it is possible to determine the regions of the organic light-emitting component 1 in which the path length of the electrical current and/or the resistance for the electrical current must be modified in order to influence the luminance or the luminance distribution in such a way that a predetermined, for example desired, luminance or luminance distribution is generated during operation. Depending on the path length determined or the resistance change determined, the structuring of the electrically conductive electrode layer 39 may then be carried out in order to be able to generate the predetermined luminance or luminance distribution.

Optionally, in the optically active and/or optically inactive region, the electrically conductive contact layer 39 and/or the first electrode 20 may merely be reduced in terms of their thickness in order to exert an effect on the luminance or the luminance distribution. This leads to a reduction of the cross-sectional area, and therefore of the conductor cross section which is available for the current feed.

If a suitable reception medium is present in the organic light-emitting component 1, for example in the case of a cavity component having a cavity encapsulation, the laser structuring may also be carried out on the already encapsulated organic light-emitting component 1. This can make it possible to use the laser structuring, and the associated influence on the luminance and the luminance gradients, in already encapsulated organic light-emitting components 1, for example as a repair method for UNI failures, a UNI failure being a degradation of the uniformity, in particular the consistency or the homogeneity, of the luminance of the organic light-emitting component 1. If the laser structuring is carried out before the encapsulation, however, this ensures that the encapsulation is not damaged by the laser beam.

The present disclosure is not restricted to the embodiments indicated. For example, more or fewer contact sections 16, 18 may be formed. Furthermore, more or fewer laser cuts 50 may be formed. As an alternative or in addition, the laser cuts 50 may have a profile other than that shown. For example, the laser cuts 50 may be applied in such a way that the remaining conductive material of the electrically conductive contact layer 39 at least partially has a meandering or spiraling profile, so that a significant increase in the path length for the current is produced in a small space.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCES organic light-emitting component 1
carrier 12
first electrode layer 14
first contact section 16
second contact section 18, 18a, 18b, 18c
first electrode 20
insulation barrier 21
organic functional layer structure 22
second electrode 23
encapsulation layer 24
first contact region 32
second contact region 34
bonding layer 36
cover body 38
electrically conductive contact layer 39
optically inactive region 40
optically active region 42
laser cut 50
severed section 52

The invention claimed is:

1. A method for producing an organic light-emitting component comprising,
providing a carrier,
forming a first electrode over the carrier,
forming an organic functional layer structure over the first electrode,
forming a second electrode over the organic functional layer structure, wherein the first electrode, the organic functional layer structure and the second electrode overlap in an optically active region which extends in the lateral direction and is configured in order to generate light, wherein, in an optically inactive region which extends over the carrier in the lateral direction, an electrically conductive contact layer is initially formed extensively over the carrier, in such a way that it is in direct physical and electrical contact with the first electrode and/or the second electrode, a first contact section and at least one second contact section of the electrically conductive contact layer are subsequently separated from one another by means of a lithographic process, in such a way that they are electrically insulated from one another,
wherein the electrically conductive contact layer is subsequently structured by means of a laser beam, and
wherein at least one further contact section, which is electrically insulated from the second contact layer, is formed by means of the structuring in the electrically conductive contact layer.

2. The method as claimed in claim 1, wherein
the first electrode is transparent and is formed in the optically active region and in the optically inactive region, and
the electrically conductive contact layer is not transparent and is formed directly on the first electrode in the optically inactive region.

3. The method as claimed in claim 1, wherein
the electrically conductive contact layer is structured in such a way that a path length which an electrical current, which flows to or away from the optically active region, after the structuring is different than before the structuring.

4. The method as claimed in claim 3, wherein
the path length after the structuring is longer than before the structuring.

5. The method as claimed in claimed 4, wherein,
during the structuring of the electrically conductive contact layer, a direct connection between a contact section for feeding or discharging electrical current and the electrode, which is connected to the electrically conductive contact layer, is interrupted so that during operation the current must flow along a detour inside the electrically conductive contact layer.

6. The method as claimed in claim 3, wherein
the path length is determined as a function of a predetermined luminance distribution, and
the path length is formed by means of the structuring.

7. The method as claimed in claim 6, wherein,
by means of the structuring, the path length is determined and formed in such a way that the resulting luminance distribution is homogeneous or at least approximately homogeneous.

8. The method as claimed in claim 6, wherein,
by means of the structuring, the path length is formed in such a way that the resulting luminance distribution has a predetermined luminance gradient.

9. The method as claimed in claim 6, wherein,
in the case of an organic light-emitting component having an unstructured electrically conductive contact layer, the luminance distribution is recorded and, depending on the recorded luminance distribution and the predetermined luminance distribution, the optical path length is determined and set for the organic light-emitting component.

10. The method as claimed in claim 1, wherein
the organic light-emitting component is segmented by means of a laser beam in the optically active region.

11. The method as claimed in claim 1, wherein,
during the structuring by means of the laser beam, the electrically conductive contact layer is fully severed and/or ablated in the thickness direction.

12. The method as claimed in claim 1, wherein,
during the structuring by means of the laser beam, the electrically conductive contact layer is only partially severed and/or ablated in the thickness direction.

13. A method for producing an organic light-emitting component comprising,
providing a carrier,
forming a first electrode over the carrier,
forming an organic functional layer structure over the first electrode,
forming a second electrode over the organic functional layer structure,
wherein the first electrode, the organic functional layer structure and the second electrode overlap in an optically active region which extends in the lateral direction and is configured in order to generate light,
wherein, in an optically inactive region which extends over the carrier in the lateral direction, an electrically conductive contact layer is initially formed extensively over the carrier, in such a way that it is in direct physical and electrical contact with the first electrode and/or the second electrode, a first contact section and at least one second contact section of the electrically conductive contact layer are subsequently formed spatially separately from one another by means of a printing process over the carrier, in such a way that they are electrically insulated from one another,
wherein the electrically conductive contact layer is subsequently structured by means of a laser beam, and
wherein at least one further contact section, which is electrically insulated from the second contact layer, is formed by means of the structuring in the electrically conductive contact layer.

14. The method as claimed in claim 13, wherein
the first electrode is transparent and is formed in the optically active region and in the optically inactive region, and
the electrically conductive contact layer is not transparent and is formed directly on the first electrode in the optically inactive region.

15. The method as claimed in claim 13, wherein
the electrically conductive contact layer is structured in such a way that a path length which an electrical current, which flows to or away from the optically active region, after the structuring is different than before the structuring.

16. The method as claimed in claim 13, wherein
the organic light-emitting component is segmented by means of a laser beam in the optically active region.

17. The method as claimed in claim 13, wherein,
during the structuring by means of the laser beam, the electrically conductive contact layer is fully severed and/or ablated in the thickness direction.

18. The method as claimed in claim 13, wherein,
during the structuring by means of the laser beam, the electrically conductive contact layer is only partially severed and/or ablated in the thickness direction.

* * * * *